(12) United States Patent
Ishitsuka et al.

(10) Patent No.: US 6,858,515 B2
(45) Date of Patent: Feb. 22, 2005

(54) PROCESS FOR PRODUCING SEMICONDUCTOR DEVICE AND SEMICONDUCTOR DEVICE PRODUCED THEREBY

(75) Inventors: Norio Ishitsuka, Chiyoda (JP); Hideo Miura, Koshigaya (JP); Shuji Ikeda, Koganei (JP); Yasuko Yoshida, Sayama (JP); Norio Suzuki, Mito (JP); Kozo Watanabe, Kokubunji (JP); Kenji Kanamitsu, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 52 days.

(21) Appl. No.: 10/638,485

(22) Filed: Aug. 12, 2003

(65) Prior Publication Data

US 2004/0077152 A1 Apr. 22, 2004

Related U.S. Application Data

(62) Division of application No. 09/580,953, filed on May 30, 2000, now Pat. No. 6,635,945.

(30) Foreign Application Priority Data

Jun. 1, 1999 (JP) ............................................ 11-153610

(51) Int. Cl.[7] .............................................. H01L 21/76
(52) U.S. Cl. ...................................... 438/424; 438/435
(58) Field of Search ................................ 438/424, 435, 438/700; 257/506, 510, 513, 524

(56) References Cited

U.S. PATENT DOCUMENTS

| | | | |
|---|---|---|---|
| 4,645,564 A | * | 2/1987 | Morie et al. |
| 4,693,781 A | * | 9/1987 | Leung et al. |
| 4,729,815 A | * | 3/1988 | Leung |
| 4,735,824 A | * | 4/1988 | Yamabe et al. |

(List continued on next page.)

FOREIGN PATENT DOCUMENTS

| | | | | |
|---|---|---|---|---|
| EP | 0 459 397 | * | 12/1991 | |
| EP | 0 660 391 | * | 6/1995 | |
| JP | 7-176604 | * | 7/1996 | |
| JP | 10-12716 | * | 10/1998 | ........... H01L/21/76 |
| WO | WO 98/12742 | * | 3/1998 | |

OTHER PUBLICATIONS

A. Chatterjee, et al., "A Shallow Trench Isolation Using LOCOS Edge For Preventing Corner Effects For 0.25/0.18μm CMOS Technologies And Beyond", Technical Digest of IEDM '96 (1996), pp. 829–832.*

Primary Examiner—David S. Blum
(74) Attorney, Agent, or Firm—Antonelli, Terry, Stout & Kraus, LLP (57) ABSTRACT

A semiconductor device free from electric failure in transistors at upper trench edges can be produced by a simplified process comprising basic steps of forming a pad oxide film on the circuit-forming side of a semiconductor substrate; forming an oxidation prevention film on the pad oxide film; removing the oxidation presention film and the pad oxide film at a desired position, thereby exposing the surface of the semiconductor substrate; horizontally recessing the pad oxide film, etching the exposed surface of the semiconductor substrate by isotropic etching; forming a trench to a desired depth, using the oxidation prevention film as a mask; horizontally recessing the pad oxide film; oxidizing the trench formed in the semiconductor substrate; embedding an embedding isolation film in the oxidized trench; removing the embedding isolation film formed on the oxidation prevention film; removing the oxidation prevention film formed on the circuit-forming side of the semiconductor substrate; and removing the pad oxide film formed on the circuit-forming side of the semiconductor substrate, where round upper trench edges with a curvature can be obtained, if necessary, by conducting isotropic etching of exposed surface of the semiconductor substrate and horizontally recessing of the pad oxide film before the oxidation of the trench, whereby only one oxidation step is required.

4 Claims, 5 Drawing Sheets

U.S. PATENT DOCUMENTS

| | | | | |
|---|---|---|---|---|
| 4,916,086 A | * | 4/1990 | Takahashi et al. | |
| 4,923,821 A | * | 5/1990 | Namose | |
| 4,931,409 A | * | 6/1990 | Nakajima et al. | |
| 5,258,332 A | * | 11/1993 | Horioka et al. | |
| 5,358,891 A | * | 10/1994 | Tsang et al. | |
| 5,536,675 A | * | 7/1996 | Bohr | |
| 5,541,425 A | * | 7/1996 | Nishihara | |
| 5,683,075 A | * | 11/1997 | Gaul et al. | |
| 5,696,402 A | * | 12/1997 | Li | |
| 5,858,859 A | * | 1/1999 | Miyashita et al. | |
| 5,863,827 A | * | 1/1999 | Joyner | 438/425 |
| 5,880,004 A | * | 3/1999 | Ho | 438/421 |
| 6,074,932 A | * | 6/2000 | Wu | 438/435 |
| 6,238,999 B1 | * | 5/2001 | Dickerson et al. | 438/424 |
| 6,274,498 B1 | * | 8/2001 | Moore et al. | 438/692 |
| 6,309,949 B1 | * | 10/2001 | He et al. | 438/424 |
| 6,329,267 B1 | * | 12/2001 | Dickerson et al. | 438/424 |
| 6,368,941 B1 | * | 4/2002 | Chen et al. | 438/424 |
| 6,372,601 B1 | * | 4/2002 | Dickerson et al. | 438/424 |
| 6,406,977 B2 | * | 6/2002 | Dickerson et al. | 438/424 |

* cited by examiner

FIG. 6A
BACKGROUND INFORMATION

FIG. 6B
BACKGROUND INFORMATION

FIG. 6C
BACKGROUND INFORMATION

FIG. 6D
BACKGROUND INFORMATION

FIG. 7A
BACKGROUND INFORMATION

FIG. 7B
BACKGROUND INFORMATION

FIG. 7C
BACKGROUND INFORMATION

FIG. 7D
BACKGROUND INFORMATION

FIG. 7E
BACKGROUND INFORMATION

PROCESS FOR PRODUCING SEMICONDUCTOR DEVICE AND SEMICONDUCTOR DEVICE PRODUCED THEREBY

This Application is a Divisional application of application Ser. No. 09/580,953, filed May 30, 2000, now U.S. Pat. No. 6,635,945 the contents of which are incorporated herein by reference in their entirety.

BACKGROUND OF THE INVENTION

The present invention relates to a process for producing a semiconductor device having a highly reliable trench isolation structure and a semiconductor device produced thereby.

An STI (shallow trench isolation) structure [or an SGI (shallow groove isolation) structure] is now available to make an electrical isolation between adjacent elements such as transistors, etc. on a semiconductor substrate. As shown in FIGS. 6A–6D, the STI structure typically comprises a shallow trench formed on a silicon substrate 1 and an oxide film embedded in the trench; and is suitable for devices of up to 0.25 μm process technologies, because its processing dimensional precision is higher than that of the so for used LOCOS structure.

Figure 6A:
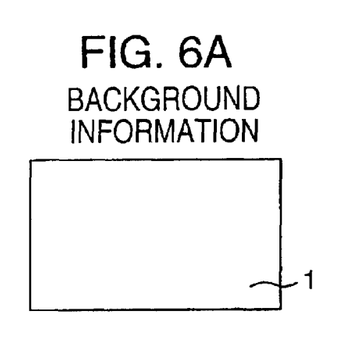
FIGS. 6A–6D are schematic views showing conventional steps of producing a trench isolation structure in a semiconductor device.
Figure 6B:
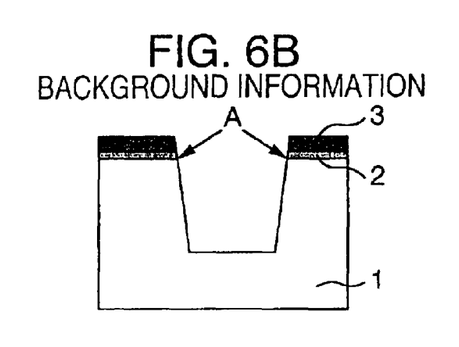
Figure 6C:
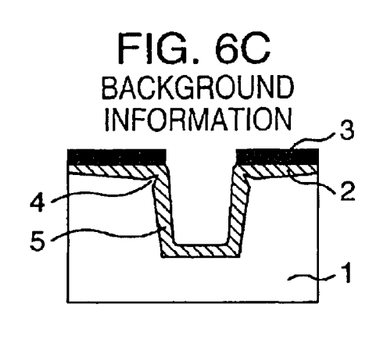
Figure 6D:
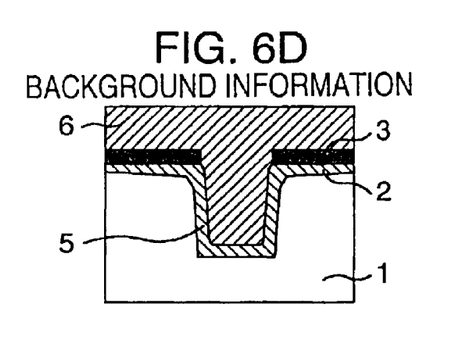

That is, a pad oxide film 2 is formed on the surface of a silicon substrate 1 by thermal oxidation, and an oxidation prevention film 3 is deposited on the pad oxide film 2. Then, a shallow trench is formed in the silicon substrate 1 (FIGS. 6A and 6B). Then, an element-isolating, thermally oxidized film 5 is formed in the trench of the silicon substrate 1 (FIG. 6C). Then, an isolation film 6 is formed thereon and filled in the trench (FIG. 6D).

However, the trench of the STI structure is formed by anisotropic dry etching (FIG. 6B), whereby corners A are formed at the upper trench edges. When further oxidized as such, the upper trench edges of the Si substrate are sometimes shaped into sharp corners 4 as shown in FIG. 6C.

The presence of such sharp corners 4 at the upper trench edges in the substrate 1 gives rise to an electric field concentration or a stress concentration, sometimes resulting in abnormal electrical characteristics of transistors.

To solve such problems, for example, A. Chatterjee, et al propose a process for rounding the upper trench edges in a substrate to a desired curvature (Technical Digest of IEDM '96, pp. 829–832). FIGS. 7A–7E show the process for giving a curvature to the upper trench edges in the substrate.

Figure 7A:
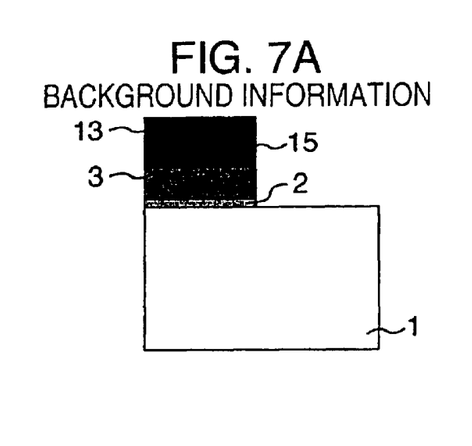
FIGS. 7A–7E are schematic views showing conventional steps of producing a trench isolation structure.
Figure 7B:
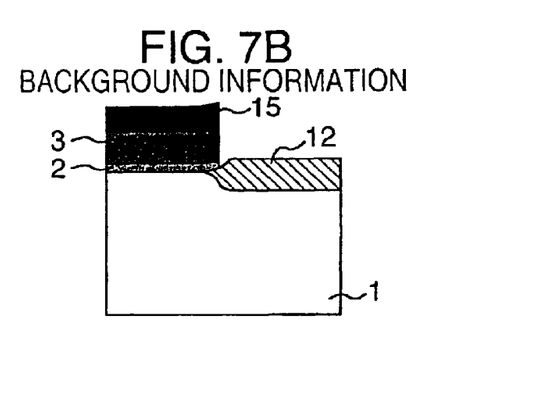
Figure 7C:
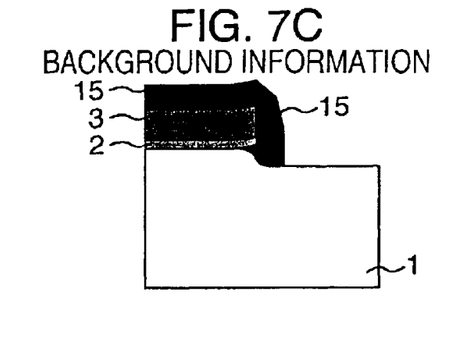
Figure 7D:
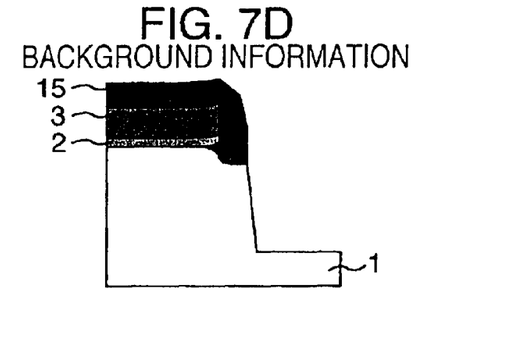
Figure 7E:
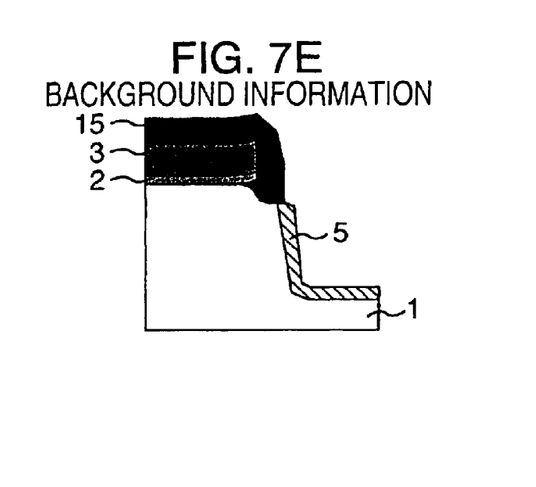

A resist 13, a TEOS film 15 and an oxidation prevention film 3 are patterned (FIG. 7A), and a LOCOS film 12 is then formed by oxidation (FIG. 7B). The LOCOS film 12 is then removed and an TEOS film 15 (an oxide film) is formed as a mask on the sides of the oxidation prevention film 3 (FIG. 7C) and a trench is formed (FIG. 7D). Then, the trench is oxidized to give a curvature to the upper trench edges of STI (FIG. 7E).

However, the process for giving a curvature to the upper trench edges in substrate requires two runs of oxidation (FIGS. 7B and 7E) and one run of film deposition (FIG. 7C) to obtain a substrate profile with a curvature at such upper trench edges, resulting in a complication of process steps.

BRIEF SUMMARY OF THE INVENTION

An object of the present invention is to provide a simplified process for producing a semiconductor device with round upper trench edges of a curvature and a semiconductor device produced thereby.

The present invention provides a process for producing a semiconductor device, which comprises:

(a) a step of forming a pad oxide film on the circuit-forming side of a semiconductor substrate, (b) a step of forming an oxidation prevention film on the pad oxide film, (c) a step of removing the oxidation prevention film and the pad oxide film at a desired position, thereby exposing the surface of the semiconductor substrate, (d) a step of horizontally recessing the pad oxide film, (e) a step of etching the exposed surface of the semiconductor substrate by isotropic etching, (f) a step of forming a trench to a desired depth, using the oxidation prevention film as a mask, (g) a step of horizontally recessing the pad oxide film, (h) a step of oxidizing the trench formed in the semiconductor substrate, (i) a step of embedding an embedding isolation film in the oxidized trench, (j) a step of removing the embedding isolation film formed on the oxidation prevention film, (k) a step of removing the oxidation prevention film formed on the circuit-forming side of the semiconductor substrate, and (l) a step of removing the pad oxide film formed on the circuit-forming side of the semiconductor substrate.

The present invention also provides a semiconductor device produced according to the aforementioned process.

DETAILED DESCRIPTION OF THE INVENTION

The aforementioned objects of the present invention can be attained by the following process (A) for removing corners at the upper edges of a trench for element isolation on the surface of a semiconductor substrate not by oxidation, but by etching:

According to the present invention, a semiconductor device can be produce by the following process (A):

(A) A process for producing a semiconductor device, which comprises:

(a) a step of forming a pad oxide film on the circuit-forming side of a semiconductor substrate, (b) a step of forming an oxidation prevention film on the pad oxide film, (c) a step of removing the oxidation prevention film and the pad oxide film at a desired position, thereby exposing the surface of the semiconductor substrate, (d) a step of horizontally recessing the pad oxide film, (e) a step of etching the exposed surface of the semiconductor substrate by isotropic etching, (f) a step of forming a trench to a desired depth, using the oxidation prevention film as a mask, (g) a step of horizontally recessing the pad oxide film, (h) a step of oxidizing the trench formed in the semiconductor substrate, (i) a step of embedding (or filling) an embedding isolation film in the oxidized trench, (j) a step of removing the embedding isolation film formed on the oxidation prevention film, (k) a step of removing the oxidation prevention film formed on the circuit-forming side of the semiconductor substrate, and (l) a step of removing the pad oxide film formed on the circuit-forming side of the semiconductor substrate, followed by conventional transistor structure formation steps.

When, in the step (e) of the aforementioned process, the exposed surface of the semiconductor substrate is etched in a T/R ratio of 1.5–2.5 by isotropic etching, where R is an etching amount of the exposed substrate surface and T is a horizontally recessing amount of the pad oxide film in the step (d), the rounding of the upper trench edges can be much more assured.

When a step (g-i) of etching back the exposed surface of the semiconductor substrate by isotropic etching and a step (g-ii) of horizontally recessing the pad oxide film are incorporated between the step (g) and the step (h) of the aforementioned process, any inconvenience appearing in the successive oxidation step can be prevented and the rounding of upper trench edges can be much more assured.

The term "horizontally recessing the pad oxide film" referred to in the aforementioned process means that the pad oxide film is horizontally etched back to remove a portion of the pad oxide film.

On the basis of the aforementioned process, the present invention can be further embodied in the following processes (B)–(D):

(B) A process for producing a semiconductor device, which comprises:

(a) a step of forming a pad oxide film on the circuit-forming side of a semiconductor substrate, (b) a step of forming an oxidation prevention film on the pad oxide film, (c) a step of removing the oxidation prevention film and the pad oxide film at a desired position, thereby exposing the surface of the semiconductor substrate, (d) a step of horizontally recessing the pad oxide film, (e) a step of etching the exposed surface of the semiconductor substrate by isotropic etching, (f) a step of forming a trench to a desired depth, using the oxidation prevention film as a mask, (g) a step of horizontally recessing the pad oxide film, (g-i) a step of etching back the exposed surface of the semiconductor substrate by isotropic etching so as to remove damage at the time of dry etching, (g-ii) a step of horizontally recessing the pad oxide film, (h) a step of oxidizing the trench formed in the semiconductor substrate, (i) a step of embedding an embedding isolation film in the oxidized trench, (j) a step of removing the embedding isolation film formed on the oxidation prevention film, (k) a step of removing the oxidation prevention film formed on the circuit-forming side of the semiconductor substrate, and (l) a step of removing the pad oxide film formed on the circuit-forming side of the semiconductor substrate.

(C) A process for producing a semiconductor device, which comprises:

(a) a step of forming a pad oxide film on the circuit-forming side of a semiconductor substrate, (b) a step of forming an oxidation prevention film on the pad oxide film, (c) a step of removing the oxidation prevention film and the pad oxide film at a desired position, thereby exposing the surface of the semiconductor substrate, (d) a step of horizontally recessing the pad oxide film, (e) a step of etching the exposed surface of the semiconductor substrate in a T/R ratio of 1.5–2.5 by isotropic etching, where T is a horizontally recessing amount of the pad oxide film in the step (d) and R is an etching amount of the exposed surface of the semiconductor substrate, (f) a step of forming a trench to a desired depth, using the oxidation prevention film as a mask, (g) a step of horizontally recessing the pad oxide film, (h) a step of oxidizing the trench formed in the semiconductor substrate, (i) a step of embedding an embedding isolation film in the oxidized trench, (j) a step of removing the embedding isolation film in the oxidized trench, (k) a step of removing the oxidation prevention film formed on the circuit-forming side of the semiconductor substrate, and (l) a step of removing the pad oxide film formed on the circuit-forming side of the semiconductor substrate.

(D) A process for producing a semiconductor device, which comprises:

(a) a step of forming a pad oxide film on the circuit-forming side of a semiconductor substrate, (b) a step of forming an oxidation prevention film on the pad oxide film, (c) a step of removing the oxidation prevention film and the pad oxide film at a desired position, thereby exposing the surface of the semiconductor substrate, (d) a step of horizontally recessing the pad oxide film, (e) a step of etching the exposed surface of the semiconductor substrate in a T/R ratio of 1.5–2.5 by isotropic etching, where T is a horizontally recessing amount of the pad oxide film in the step (d) and R is an etching amount of the exposed surface of the semiconductor substrate, (f) a step of forming a trench to a desired depth, using the oxidation prevention film as a mask, (g) a step of horizontally recessing the pad oxide film, (g-i) a step of etching back the exposed surface of the semiconductor substrate by isotropic etching so as to remove damage at the time of dry etching, (g-ii) a step of horizontally recessing the pad oxide film, (h) a step of oxidizing the trench formed in semiconductor substrate, (i) a step of embedding an embedding isolation film in the oxidized trench, (j) a step of removing the embedding isolation film formed on the oxidation prevention film, (k) a step of removing the oxidation prevention film formed on the circuit-forming side of the semiconductor substrate, and (l) a step of removing the pad oxide film formed on the circuit-forming side of the semiconductor substrate.

According to the present invention, the following semiconductor devices (E)–(H) can be produced by the aforementioned processes (A)–(D):

(E) A semiconductor device is produced by forming a pad oxide film on the circuit-forming side of a semiconductor substrate; forming an oxidation prevention film on the pad oxide film; removing the oxidation prevention film and the pad oxide film at a desired position, thereby exposing the surface of the semiconductor substrate; horizontally recessing the pad oxide film; etching the exposed surface of the semiconductor substrate by isotropic etching; forming a trench to a desired depth, using the oxidation prevention film as a mask; horizontally recessing the pad oxide film; oxidizing the trench formed in the semiconductor substrate; embedding (or filling) an embedding isolation film in the oxidized trench; removing the embedding isolation film formed on the oxidation prevention film; removing the oxidation prevention film formed on the circuit-forming side of the semiconductor substrate; and removing the pad oxide film formed on the circuit-forming side of the semiconductor substrate, followed by ordinary necessary steps for producing a transistor structure.

(F) A semiconductor device is produced by forming a pad oxide film on the circuit-forming side of a semiconductor substrate; forming an oxidation prevention film on the pad oxide film; removing the oxidation prevention film and the pad oxide film at a desired position, thereby exposing the surface of the semiconductor substrate; horizontally recessing the pad oxide film; etching the exposed surface of the semiconductor substrate in a T/R ratio of 1.5–2.5 by isotropic etching, where T is a horizontally recessing amount of the pad oxide film and R is an etching amount of the exposed surface of the semiconductor substrate; forming a trench to a desired depth, using the oxidation prevention film as a mask; horizontally recessing the pad oxide film; oxidizing the trench formed in the semiconductor substrate; embedding an embedding isolation film in the oxidized trench; removing the embedding isolation film formed on the oxidation prevention film; removing the oxidation prevention film formed on the circuit-forming side of the semiconductor substrate; and removing the pad oxide film formed on the circuit-forming side of the semiconductor substrate, followed by ordinary necessary steps for producing a transistor structure.

(G) A semiconductor device is produced by forming a pad oxide film on the circuit-forming side of a semiconductor substrate; forming an oxidation prevention film on the pad oxide film; removing the oxidation prevention film and the pad oxide film at a desired position, thereby exposing the surface of the semiconductor substrate; horizontally recessing the pad oxide film; etching the exposed surface of the semiconductor substrate in a T/R ratio of 1.5–2.5 by isotropic etching, where T is a horizontally recessing amount of the pad oxide film and R is an etching amount of the exposed surface of the semiconductor substrate; forming a trench to a desired depth, using the oxidation prevention film as a mask; horizontally recessing the pad oxide film; etching back the exposed surface of the semiconductor substrate by isotropic etching so as to remove damage at the time of dry etching; horizontally recessing the pad oxide film; oxidizing the trench formed in the semiconductor substrate; embedding an embedding isolation film in the oxidized trench; removing the embedding isolation film formed on the oxidation prevention film; removing the oxidation prevention film formed on the circuit-forming side of the semiconductor substrate; and removing the pad oxide film formed on the circuit-forming side of the semiconductor substrate, followed by ordinary necessary steps for producing a transistor structure.

(H) A semiconductor device is produced by forming a pad oxide film on the circuit-forming side of a semiconductor substrate; forming an oxidation prevention film on the pad oxide film; removing the oxidation prevention film and the pad oxide film at a desired position, thereby exposing the surface of the semiconductor substrate; horizontally recessing the pad oxide film; etching the exposed surface of the semiconductor substrate by isotropic etching; forming a trench to a desired depth, using the oxidation prevention film as a mask; horizontally recessing the pad oxide film; etching back the exposed surface of the semiconductor substrate by isotropic etching capable of horizontally recessing the pad oxide film so as to remove damage at the time of dry etching; horizontally recessing the pad oxide film; oxidizing the trench formed in the semiconductor substrate; embedding an embedding isolation film in the oxidized trench; removing the embedding isolation film formed on the oxidation prevention film; removing the oxidation prevention film formed on the circuit-forming side of the semiconductor substrate; and removing the pad oxide film formed on the circuit-forming side of the semiconductor substrate, followed by ordinary necessary steps for producing a transistor.

As described above, a radius of curvature is given to the upper trench edges in a silicon substrate by isotropic etching, and the necessary oxidation treatment in the process for giving a curvature to the upper trench edges in the silicon substrate can be carried out only in one run, resulting in simplification of the process.

Embodiments of the present invention will be described in detail below, referring to the drawings.

Figure 1A:
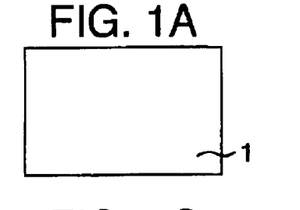
FIGS. 1A–1L are structural cross-sectional views showing a process for producing a trench isolation structure in a semiconductor device according to one embodiment of the present invention.
Figure 1B:
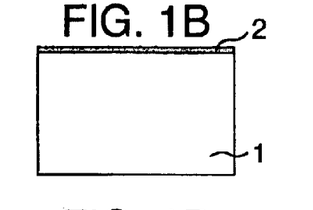
Figure 1C:
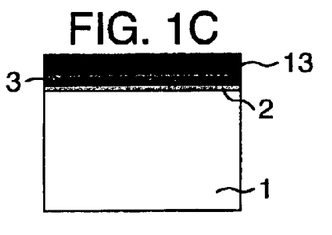
Figure 1D:
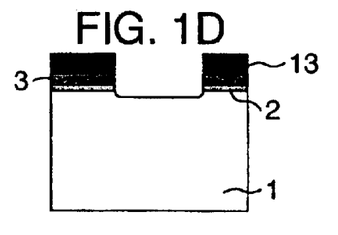
Figure 1E:
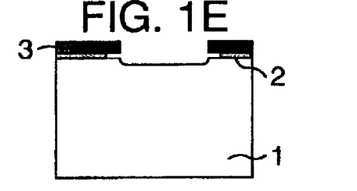
Figure 1F:
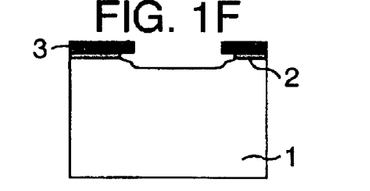
Figure 1G:
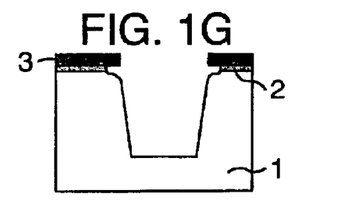
Figure 1H:
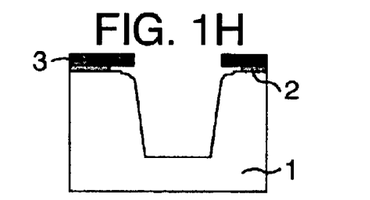
Figure 1I:
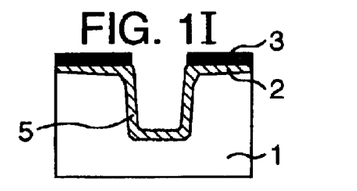
Figure 1J:
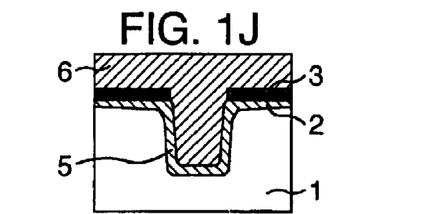
Figure 1K:
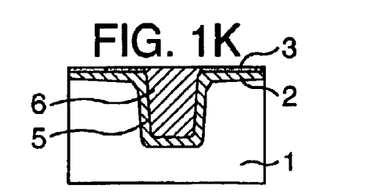
Figure 1L:
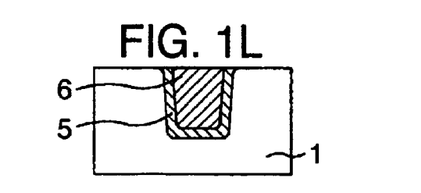
Figure 2:
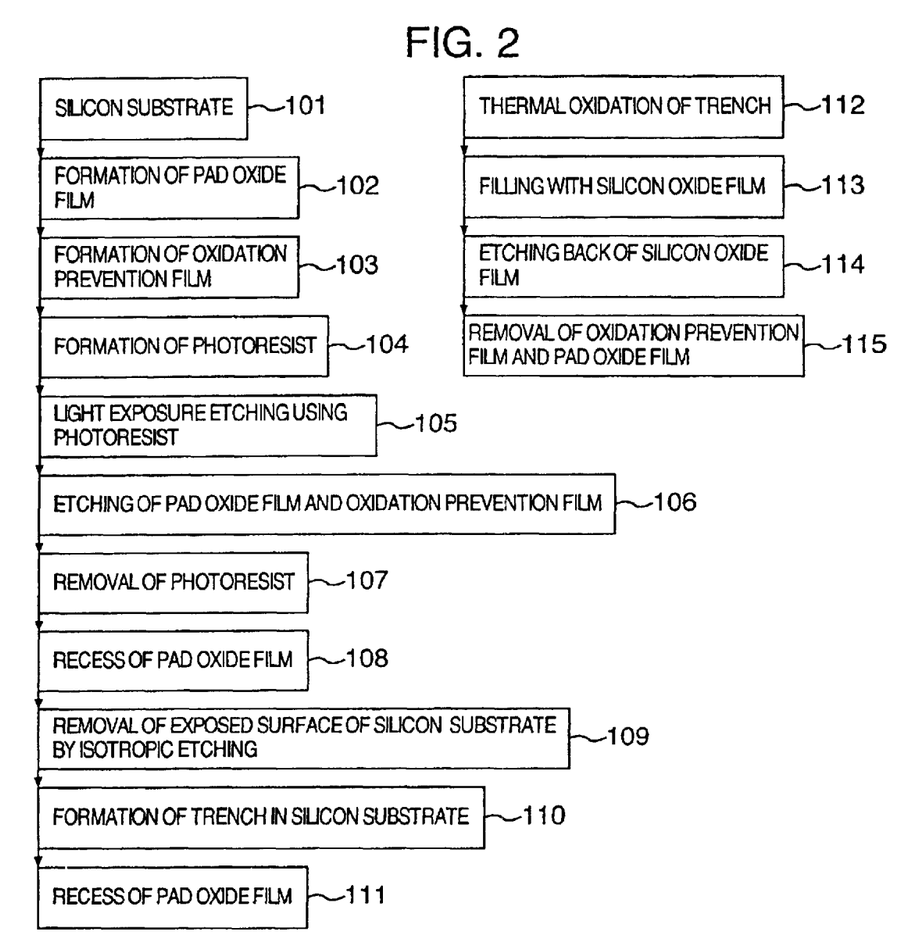
FIG. 2 is a flow chart showing a process for producing the trench isolation structure shown in FIGS. 1A–1L.

FIGS. 1A–1L are structural cross-sectional views showing a process for producing semiconductor device according to one embodiment of the present invention, and FIG. 2 is a flow chart showing the outline of the process. The process will be described below along the flow chart of FIG. 2, referring to FIGS. 1A–1L.

(1) The surface of a semiconductor substrate, e.g. silicon substrate 1, is thermally oxidized under the ordinary conditions, e.g. 800°–1000° C., to form a pad oxide film 2 having a thickness of 5–15 nm, preferably about 10 nm (steps 101 and 102 of FIG. 2; FIGS. 1A and 1B).

(2) An oxidation prevention film 3, e.g. $Si_3N_4$ film, is deposited on the pad oxide film 2 to an ordinary thickness, e.g. about 200 nm (step 103 of FIG. 2).

(3) A photoresist 13 is formed on the oxidation prevention film 3 (step 104 of FIG. 2; FIG. 1C).

(4) The photoresist 13 is removed at a desired position, using the ordinary light exposure and then the oxidation prevention film 3 and the pad oxide film 2 are removed by dry etching, etc. Etching proceeds not only on pad oxide film 2, but also the Si surface is overetched (step 105 and 106 of FIG. 2; FIG. 1D).

(5) Then, the photoresist is removed, and the pad oxide film 2 is horizontally recessed by HF, etc. The exposed surface of the silicon substrate 1 is etched by isotropic etching (dry or wet etching)(steps 107–109 of FIG. 2; FIGS. 1E and 1F). A solution for the wet etching can be a solution mixture of $NH_3$, $H_2O$ and $H_2O_2$, which is usually used for substrate cleaning. The horizontally recessing amount of the pad oxide film 2 is preferably about 10 to about 30 nm from the viewpoint of up to 0.14 μm process technologies, while the etching (downwardly recessing) amount of the exposed surface of the silicon substrate by isotropic etching is preferably about 5 to about 15 nm.

(6) A shallow trench is formed at a specific angle of the trench side wall to the surface of the silicon substrate 1 (e.g. an angle of 90–110° at A shown in FIG. 6B), using the oxidation prevention film 3 as a mask (step 110 of FIG. 2; FIG. 1G).

(7) Then, the pad oxide film 2 is horizontally recessed from the edge by a distance of 5–40 nm by etching with HF, etc. (step 111 of FIG. 2; FIG. 1H).

(8) Then, the surface of the silicon substrate 1 is thermally oxidized to a thickness of about 10 nm, for example, in a dry oxidative atmosphere at 900° to 1,100° C. upon dilution of the oxygen concentration to form an element isolation thermally oxidized film 5 in the trench (step 112 of FIG. 2; FIG. 1I).

(9) An embedding isolation film such as a silicon oxide film, etc. is deposited and embedded (or filled) in the trench by chemical vapor deposition (CVD), sputtering, etc. to form an embedding isolation film 6. Since the silicon oxide film, etc. formed by CVD, sputtering, etc. are usually rough films, the silicon substrate 1 may be further oxidized in an annealing or oxidative atmosphere at about 1,100° C. after the deposition of the embedding isolation film 6 to make the silicon oxide film, etc. compact (step 113 of FIG. 2; FIG. 1J).

(10) The embedding isolation film 6 is removed by etching back, using chemical/mechanical polishing (CMP) or dry etching, where the oxidation prevention film 3 acts as an etching stopper to prevent the silicon substrate 1 under the oxidation prevention film 3 from etching (step 114 of FIG. 2; FIG. 1K).

(11) Then, the oxidation prevention film 3 and the pad oxide film 2 are removed, whereby the trench-embedded structure is completed (step 115 of FIG. 2; FIG. 1L).

Then, the semiconductor device can be completed through the ordinary necessary steps for producing a transistor structure such as formation of a gate oxide film and a gate electrode, introduction of impurities, formation of multilayer wiring structure such as wiring, interlayer isolation films, etc., formation of a surface protective layer, etc.

Functions and effects of one embodiment according to the present invention will be described below:

Differences of the one embodiment according to the present invention from the conventional art are the following 3 points:
(1) horizontal recessing of pad oxide film 2 in step (d), (2) etching of exposed surface of silicon substrate 1 by isotropic etching in step (e) and (3) horizontal recessing of pad oxide film 2 from the trench edge by 5–40 nm, preferably 10–20 nm in step (g).

In simple formation of a curvature at the upper trench edges, it is important to remove (round) in advance the corners of the substrate 1 formed when the oxidation prevention film 3 is etched (e.g. A indicated in FIG. 6B). In the conventional art, removal of the corner is carried out by oxidation, but in the present invention it is done by isotropic etching.

Function of steps (d) and (e) will be described below, referring to FIGS. 3A and 3B.

Figure 3A:
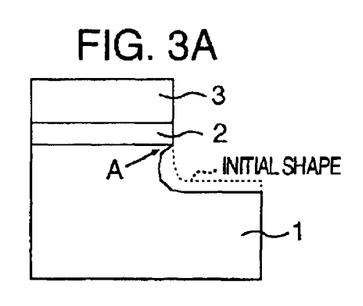
FIGS. 3A and 3B are schematic views showing the function and effect of one embodiment according to the present invention.
Figure 3B:
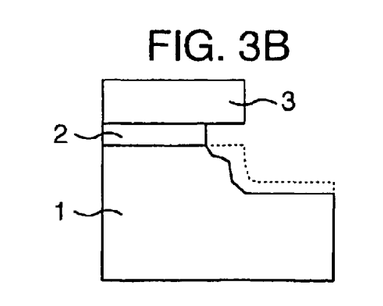

FIGS. 3A and 3B schematically show test results of isotropic etching of the exposed surface of the silicon substrate 1 without horizontal recessing of the pad oxide film 2 after the removal of the oxidation prevention film 3.

In FIG. 3A, A at the upper trench edge in the substrate 1 in contact with the pad oxide film 2 is in a sharp profile, because etching proceeds in every directions in the region not in contact with the pad oxide film 2, but etching proceeds in one direction in the region in contact with the pad oxide film 2, thereby giving said sharp corner in the profile.

Thus, no such a sharp corner in the profile can appear by horizontally recessing the pad oxide film 2 before the isotropic etching, and the corners can be preferentially removed by the isotropic etching, resulting in a profile without any sharp corners, as shown in FIG. 3B, with easy formation of a curvature by successive oxidation.

Figure 4A:
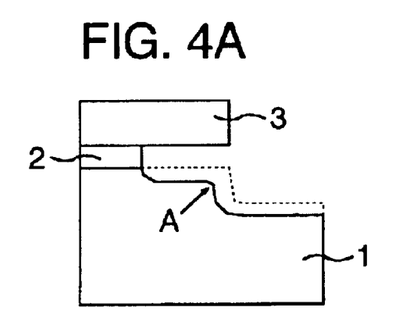
FIGS. 4A and 4B are schematic views showing the function and effect in detail of the one embodiment according to the present invention.

However, unless the horizontally recessing amount T of the pad oxide film 2 and the etching amount R of the substrate surface are carried out appropriately, corners A are formed again, as shown in FIG. 4A, with difficult formation of a curvature by successive oxidation.

Figure 4B:
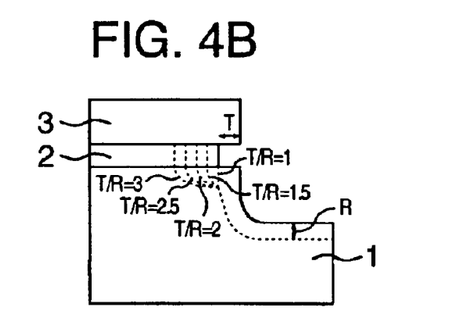

FIG. 4B shows relations of the horizontally recessing amount of T of the pad oxide film 2 to the etching amount R of the substrate surface, where a T/R ratio, i.e. a ratio of horizontally recessing amount T to etching amount R, is given from 1 to 3 at intervals of 0.5, while making the etching amount R constant.

As is evident from FIG. 4B, corner-free substrate profiles can be obtained at T/R ratios between 1.5 and 2.5, but a vertical substrate profile can be obtained at a T/R ratio of 1. At a T/R ratio of 3, on the other side, the step becomes so wide that a corner appears again in the profile. A curvature is hard to obtain by oxidation at a T/R ratio of 1 or 3, and thus a T/R ratio of 1.5–2.5 is preferable.

Functions and effects of step (g) will be described below, referring to FIGS. 5A–5B.

Figure 5A:
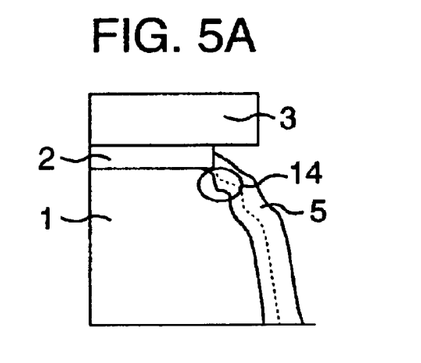
FIGS. 5A–5B are schematic views showing the function and effect in detail according to the one embodiment of the present invention.
Figure 5B:
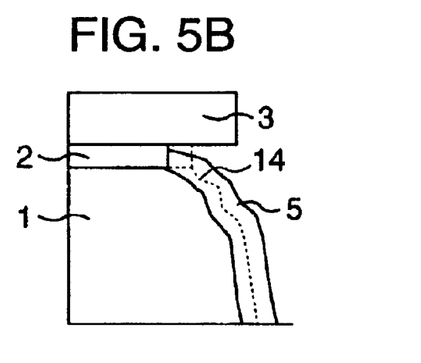

FIGS. 5A and 5B show substrate profiles at the end of trench formation step (f) by dotted lines. In the profiles shown by dotted lines, the silicon substrate 1 is horizontally recessed at the edges of the pad oxide film 2, giving a step (or level difference) 14. When oxidation is carried out in that state, the step will have a sharp corner in the profile, as shown by a full line in FIG. 5A, for the following reasons:

In the regions near the edges of the pad oxide film 2, the oxidation prevention film 3 becomes warped by volumic expansion (about 2-fold) due to the oxidation, giving a compressive stress as a force of reaction.

It is known that when the compressive stress is developed in the oxide film, the oxidation is suppressed, and thus the oxidation is suppressed in the regions near the edges of the pad oxide film 2. In regions a little far from the edges of the pad oxide film 2, the influence of the compressive stress becomes less, so that the oxidation proceeds smoothly to widen the step.

Thus, as shown in FIG. 5B, when the pad oxide film 2 is horizontally recessed, such influences will be less on the step and the step formed by the etching will be removed by the oxidation, giving a smooth substrate profile.

After formation of a trench in the silicon substrate 1 in step (f), damages are sometimes given to the trench surface by dryetching. To remove the damages, the silicon substrate 1 must be etched back to a depth of a few nm from the surface by isotropic etching, so that the step in the profile of the silicon substrate 1 becomes much wider at the edges of the pad oxide film.

Thus, the step can be made narrow by further horizontally recessing the pad oxide film 2 by HF, etc. by the steps (g-i) and (g-ii) before the oxidation of the trench [step (h)]. Thus, when damages are given by dry etching, it is preferable to conduct the steps (g-i) and (g-ii) for horizontally recessing the pad oxide film 2 so as to remove damage at the time of dry etching.

For the foregoing reasons, a curvature can be given at the upper trench edges according to the one embodiment of the present invention, as in the conventional art, and the process steps can be much more simplified in the present invention.

That is, in the one embodiment of the present invention, a curvature is given at the upper trench edges in the substrate 1 by isotropic etching, and thus in the steps (d)–(h) for giving a curvature at the upper trench edges in the substrate 1 the necessary oxidation treatment can be carried out only by one run [step (h)], simplifying the process steps.

Thus, the present invention provides a simplified process for producing a semiconductor device with round upper trench edges of a curvature and a semiconductor device produced thereby.

As described above, the present invention provides a process for producing a semiconductor device without any deterioration of voltage-withstanding characteristics of transistors and capacities by effectively using isotropic etching with no increase in the number of oxidation step, and also a semiconductor device produced thereby. That is, the present invention provides a simplified process for producing a semiconductor device with round upper trench edges of a curvature and a semiconductor device produced thereby.

What is claimed is:

1. A process for producing a semiconductor device, which comprises:
   (a) a step of forming a pad oxide film on the circuit-forming side of a semiconductor substrate,
   (b) a step of forming an oxidation prevention film on the pad oxide film,
   (c) a step of removing the oxidation prevention film and the pad oxide film at a desired position, thereby exposing the surface of the semiconductor substrate,
   (d) a step of horizontally recessing the pad oxide film,
   (e) a step of etching the exposed surface of the semiconductor substrate by isotropic etching,
   (f) a step of forming a trench to a desired depth, using the oxidation prevention film as a mask,
   (g) a step of horizontally recessing the pad oxide film,
   (h) a step of oxidizing the trench formed in the semiconductor substrate,
   (i) a step of embedding an embedding isolation film in the oxidized trench,
   (j) a step of removing the embedding isolation film formed on the oxidation prevention film,
   (k) a step of removing the oxidation prevention film formed on the circuit-forming side of the semiconductor substrate, and
   (l) a step of removing the pad oxide film formed on the circuit-forming side of the semiconductor substrate.

2. A process for producing a semiconductor device, which comprises:
   (a) a step of forming a pad oxide film on the circuit-forming side of a semiconductor substrate,
   (b) a step of forming an oxidation prevention film on the pad oxide film,
   (c) a step of removing the oxidation prevention film and the pad oxide film at a desired position, thereby exposing the surface of the semiconductor substrate,
   (d) a step of horizontally recessing the pad oxide film,
   (e) a step of etching the exposed surface of the semiconductor substrate by isotropic etching,
   (f) a step of forming a trench to a desired depth, using the oxidation prevention film as a mask,
   (g) a step of horizontally recessing the pad oxide film,
   (g-i) a step of etching back the exposed surface of the semiconductor substrate by isotropic etching,
   (g-ii) a step of horizontally recessing the pad oxide film,
   (h) a step of oxidizing the trench formed in the semiconductor substrate,
   (i) a step of embedding an embedding isolation film in the oxidized trench,
   (j) a step of removing the embedding isolation film formed on the oxidation prevention film,
   (k) a step of removing the oxidation prevention film formed on the circuit-forming side of the semiconductor substrate, and
   (l) a step of removing the pad oxide film formed on the circuit-forming side of the semiconductor substrate.

3. A process for producing a semiconductor device, which comprises:
   (a) a step of forming a pad oxide film on the circuit-forming side of a semiconductor substrate,
   (b) a step of forming an oxidation prevention film on the pad oxide film,
   (c) a step of removing the oxidation prevention film and the pad oxide film at a desired position, thereby exposing the surface of the semiconductor substrate,
   (d) a step of horizontally recessing the pad oxide film,
   (e) a step of etching the exposed surface of the semiconductor substrate in a T/R ratio of 1.5–2.5 by isotropic etching, where T is a horizontally recessing amount of the pad oxide film in the step (d) and R is an etching amount of the exposed surface of the semiconductor substrate,
   (f) a step of forming a trench to a desired depth, using the oxidation prevention film as a mask,
   (g) a step of horizontally recessing the pad oxide film,
   (h) a step of oxidizing the trench formed in the semiconductor substrate,
   (i) a step of embedding an embedding isolation film in the oxidized trench,
   (j) a step of removing the embedding isolation film formed on the oxidation prevention film,
   (k) a step of removing the oxidation prevention film formed on the circuit-forming side of the semiconductor substrate, and
   (l) a step of removing the pad oxide film formed on the circuit-forming side of the semiconductor substrate.

4. A process for producing a semiconductor device, which comprises:
   (a) a step of forming a pad oxide film on the circuit-forming side of a semiconductor substrate,
   (b) a step of forming an oxidation prevention film on the pad oxide film,
   (c) a step of removing the oxidation prevention film and the pad oxide film at a desired position, thereby exposing the surface of the semiconductor substrate,
   (d) a step of horizontally recessing the pad oxide film,
   (e) a step of etching the exposed surface of the semiconductor substrate in a T/R ratio of 1.5–2.5 by isotropic etching, where T is a horizontally recessing amount of the pad oxide film in the step (d) and R is an etching amount of the exposed surface of the semiconductor substrate, (f) a step of forming a trench to a desired depth, using the oxidation prevention film as a mask, (g) a step of horizontally recessing the pad oxide film, (g-i) a step of etching back the exposed surface of the semiconductor substrate by isotropic etching, (g-ii) a step of horizontally recessing the pad oxide film, (h) a step of oxidizing the trench formed in the semiconductor substrate, (i) a step of embedding an embedding isolation film in the oxidized trench, (j) a step of removing the embedding isolation film formed on the oxidation prevention film, (k) a step of removing the oxidation prevention film formed on the circuit-forming side of the semiconductor substrate, and (l) a step of removing the pad oxide film formed on the circuit-forming side of the semiconductor substrate.

* * * * *